United States Patent
Gianordoli

(10) Patent No.: US 10,147,855 B2
(45) Date of Patent: Dec. 4, 2018

(54) ILLUMINATION DEVICE

(71) Applicant: Swareflex GmbH, Vomp (AT)

(72) Inventor: Stefan Gianordoli, Baden (AT)

(73) Assignee: Swareflex GmbH, Vomp (AT)

(*) Notice: Subject to any disclaimer, the term of this patent is extended or adjusted under 35 U.S.C. 154(b) by 0 days.

(21) Appl. No.: 15/889,290

(22) Filed: Feb. 6, 2018

(65) Prior Publication Data

US 2018/0159003 A1    Jun. 7, 2018

Related U.S. Application Data

(63) Continuation of application No. 15/313,383, filed as application No. PCT/EP2015/062051 on May 31, 2015, now Pat. No. 9,923,131.

(30) Foreign Application Priority Data

Jun. 2, 2014  (EP) .................................. 14170820

(51) Int. Cl.
*H01L 33/58* (2010.01)
*H01L 33/30* (2010.01)
*H01L 33/32* (2010.01)

(52) U.S. Cl.
CPC .............. *H01L 33/58* (2013.01); *H01L 33/30* (2013.01); *H01L 33/32* (2013.01); *H01L 2224/16145* (2013.01); *H01L 2224/48247* (2013.01); *H01L 2224/48463* (2013.01); *H01L 2224/49107* (2013.01); *H01L 2224/73265* (2013.01); *H01L 2933/0058* (2013.01)

(58) Field of Classification Search
CPC .......... H01L 33/58; H01L 33/30; H01L 33/32
See application file for complete search history.

(56) References Cited

U.S. PATENT DOCUMENTS

| | | | |
|---|---|---|---|
| 9,887,325 B2* | 2/2018 | Kwon | H01L 33/501 |
| 2006/0091411 A1 | 5/2006 | Ouderkirk et al. | |
| 2011/0006688 A1 | 1/2011 | Shim | |
| 2011/0062469 A1 | 3/2011 | Camras et al. | |
| 2011/0062471 A1 | 3/2011 | Bierhuizen et al. | |
| 2011/0089447 A1 | 4/2011 | Kuo et al. | |
| 2012/0153306 A1 | 6/2012 | Yao | |
| 2012/0217531 A1* | 8/2012 | Katsuno | H01L 33/40 257/99 |
| 2015/0372192 A1* | 12/2015 | Epler | H01L 33/16 257/76 |

FOREIGN PATENT DOCUMENTS

WO    WO 2009/132837 A2    11/2009

OTHER PUBLICATIONS

International Search Report for PCT/EP2015/062051, dated Aug. 24, 2015, 3 pages.

* cited by examiner

*Primary Examiner* — Phuc T Dang
(74) *Attorney, Agent, or Firm* — Dority & Manning, P.A.

(57) ABSTRACT

There is proposed an illuminating device, comprising
(a) a luminous element,
(b) a support, and
(c) a primary optical element,
characterized in that
(i) said luminous element (a) is present on the support (b), and
(ii) said primary optical element (c) is arranged on a composite of luminous element (a) and support (b) in such a way that it takes up, directs and emits the radiation emerging from the luminous element in the desired light distribution, wherein
(iii) said primary optical element (c) is fabricated from a high refractive index glass and
(iv) attached to the support by direct bonding.

14 Claims, 2 Drawing Sheets

Light emission in a conventional LED with a directing device for the radiation (left) and a flip-chip LED (right)

Structure of a conventional LED (left) and a flip-chip LED (right)

Light emission in a conventional LED (left) and a flip-chip LED (right)

Light emission in a conventional LED with a directing device for the radiation (left) and a flip-chip LED (right)

Lens types: a) chip scale lens, b) mushroom lens, c) conformal lens

ILLUMINATION DEVICE

CROSS REFERENCE TO RELATED APPLICATIONS

This application is a continuation of U.S. patent application Ser. No. 15/313,383, having a filing date of Nov. 22, 2016, now issued as U.S. Pat. No. 9,923,131, which is the national stage entry of International Patent Application No. PCT/EP2015/062051, having a filing date of May 31, 2015, which claims priority to and the benefit of European Patent Application No. 14170820.6 filed in the European Patent Office on Jun. 2, 2014, the entire contents of which are incorporated herein by reference.

FIELD OF THE INVENTION

The invention pertains to the field of electrical engineering and relates to an illuminating device, especially a so-called flip-chip LED ("FC LED"), consisting of a composite of a luminous element and a support ("LED chip") as well as a primary optical element, and to the use thereof for illuminating objects.

BACKGROUND ART

A "flip-chip LED" technology means one in which the luminous element, usually an LED, is mounted upside down as shown in FIG. 1a. First industrial property rights in this field trace back to Matsushita (e.g., JP 57 092881 A1) and date from the early 1980's. Today, there are more than 1000 patent publications relating to this topic.

In this connection, reference may be made to US 2011 062469 A1 (Philips). This document relates to a light-emitting unit consisting of an LED, a lens, a window element, a bond at the interface between the lens and window element, wherein the window element is bonded to the lens.

US 2012 153306 A1 (YAO) discloses a light-emitting diode (LED) chip, comprising: a flip-chip LED and a lens applied to the topmost surface of the flip-chip LED, wherein said lens contains a non-polymeric material, and essentially no polymer materials come into contact with the LED chip.

From US 2011 062471 A1 (Bierhuizen). This application relates to an LED module with a lens having a modular structure, wherein said LED module is adhesively bonded to the support.

WO 2009/132837 A2 (Schott) claims a converter component for the radiation emitted and/or to be received by an opto-electronic functional element, preferably by an LED, for mounting onto an opto-electronic functional element comprising at least one converter for converting the emitted radiation and/or the radiation to be received, and at least one optical component, said converter and said optical component being adjacent and bonded to one another at least over segments thereof.

FC LEDs have a number of important advantages over the conventional products, in particular, they ensure a quicker heat dissipation, which significantly increases the service life. Also, FC LEDs do not require any devices to direct the light into a particular direction, and they ensure a high image brightness even in reflection, as schematically represented in FIGS. 1b and 1c.

Another important aspect is the fact that FC LEDs can be produced more easily and more quickly, because after the EPI wafer stage, only die bonding and a modulation are required to finish the component. Thus, the steps of wire bonding and encapsulating the phosphor, in particular, are saved.

The chips are mostly enclosed by transparent lens-shaped hollow bodies, wherein plastics, predominantly polydimethylsiloxanes, are usually employed as the material. These have prevailed especially in the known and established nitride-based compound semiconductor chips, because they do not absorb the outgoing radiation and therefore show no, or only very little, signs of wear.

However, silicones have remarkably low refractive indices, typically around 1.40 to 1.41. This means that there usually is a significant difference in the refractive indices between the chip and the casing, with the consequence that the emission of radiation from the chip is greatly reduced.

In the past, it was tried to solve this problem by chemically modifying the polydimethylsiloxanes, for example, by incorporating aromatic groups. These approaches are actually rather counterproductive, because the modification of the siloxanes ultimately leads to an increase of the absorption of the light exiting the chip into the silicone body, so that the outgoing radiation is reduced rather than enhanced, the silicone casing increasingly loses its transparency, and the absorption losses can be increased thereby.

Another disadvantage in connection with the use of silicones as casings for FC LEDs is the fact that the refractive index becomes lower as the temperature increases, that they have a high permeability for gases and water, and exhibit a low hardness.

Thus, it has been the object of the present invention to provide illuminating devices of the flip-chip LED type that overcome the described drawbacks of the prior art. In particular, the components should be equipped with casings having a similar refractive index as the composite of support and luminous element, be resistant to temperature and environmental influences, have no permeability to gases and water, and possess a hardness higher than that of polysiloxanes.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DESCRIPTION OF THE INVENTION

Figure 1A:
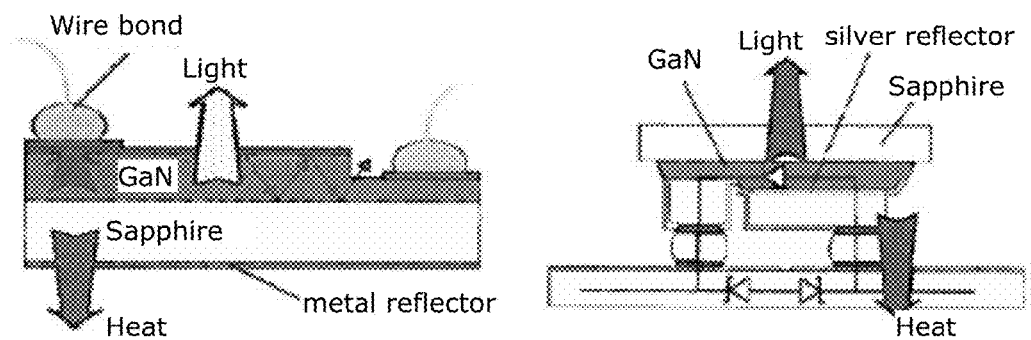
FIG. 1a illustrates the structure of a conventional LED on the left and the structure of a flip-chip LED on the right.
Figure 1B:
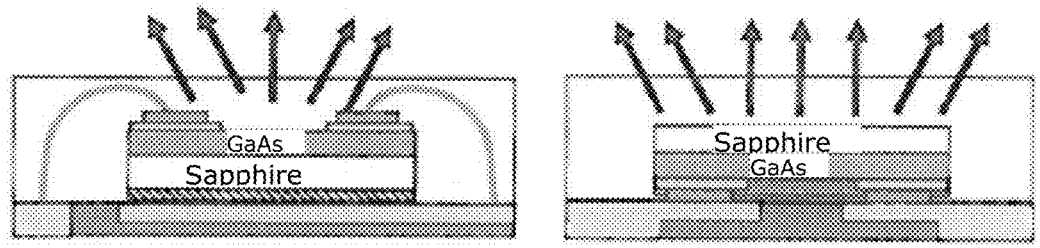
FIG. 1b illustrates the light emission in a conventional LED on the left and the light emission of a flip-chip LED on the right.
Figure 1C:
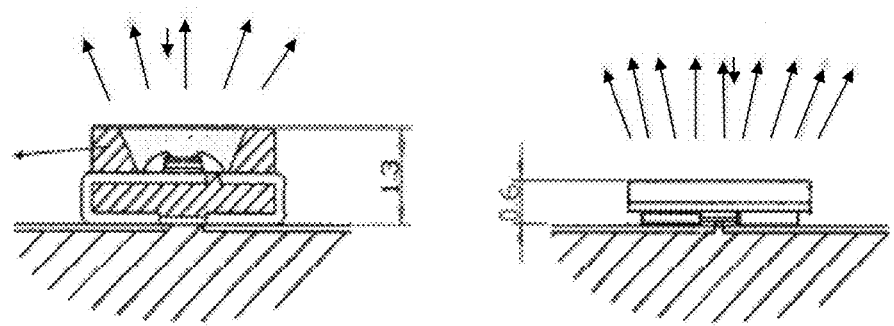
FIG. 1c is illustrates the light emission in a conventional LED with a directing device on the left and the light emission of a flip-chip LED on the right.

The invention relates to an illuminating device, comprising
(a) a luminous element,
(b) a support, and
(c) a primary optical element,
characterized in that
(i) said luminous element (a) is present on the support (b), and (ii) said primary optical element (c) is arranged on the composite of luminous element (a) and support (b) in such a way that it takes up, directs and emits the radiation emerging from the luminous element in the desired light distribution, wherein
(iii) said primary optical element (c) is fabricated from a high refractive index glass and
(iv) attached to the support by direct bonding.

Surprisingly, it has been found that primary optical elements that are fabricated from a high refractive index glass and directly attached to the LED chip by "direct bonding" (also referred to as "physical bonding") achieve the object to the full extent thereof. Thus, there is no separate bonding layer, such as an adhesive, between the primary optical element and the LED chip, because this would lead to similar problems as those described above.

Luminous Elements

Even though it is often referred to "flip-chip LEDs" within the scope of the present invention, because this has been the technical term for the present technology so far, the invention is not limited to the embodiment of the luminous element as an LED. Actually, it may also be an OLED, an LET or an OLET.

LEDs

LEDs, also referred to as light-emitting diodes, are light-emitting semiconductor components whose electrical properties correspond to those of a diode. If an electric current flows through the diode in the forward direction, it emits light, IR radiation and UV radiation with a wavelength depending on the type of semiconductor material and dopants.

The semiconductor crystal of many light-emitting diodes is soldered onto the bottom of a conical depression in a metal holder. The inner sides of the depression act as reflectors for the light emerging from the sides of the crystal. The solder joint forms one of the two electrical contacts of the crystal. At the same time, it absorbs the waste heat forming because the semiconductor crystal converts only part of the electric power to light. In wired light-emitting diodes, the holder with the reflector is designed as a wire with a rectangular cross-section serving as an electric contact. Contrary to the usual practice in electronic components, the lead wire is not made of tin-plated copper, but of tin-plated steel. The thermal conductivity of steel is comparatively low. As a result, the semiconductor crystal is not destroyed by overheating when the component is soldered into a printed circuit board. The upper side of the crystal is electrically connected with the second steel lead wire only through a thin bond wire, in order that the contact covers very little of the light-emitting surface.

High performance light-emitting diodes (H-LEDs) are operated with currents higher than 20 milliamperes. This places special requirements for heat dissipation, which are manifested by specific designs. The heat may be dissipated through the power supply lines, through the reflector trough or through heat conductors incorporated into the light-emitting diode body.

Further suitable LED designs that may be employed as light sources in accordance with the present invention include direct wire bonding of the light-emitting diode chip on the board (chip on board), later embedded in cast silicone compositions.

The LEDs employed as light sources may also be multi-colored. Multicolored light-emitting diodes consist of several (two or three) diodes in one casing. They mostly have a common anode or cathode and a lead for every color. In a design with two leads, two light-emitting diode chips are antiparallel connected. Depending on the polarity, one diode or the other is emitting light. A virtually continuous color change can be realized through a variable pulse width ratio of a suitable alternating current.

The basic design of the light-emitting diodes of the invention is that of a semiconductor pn junction diode; therefore, light-emitting diodes have the same basic properties as these. A big difference resides in the type of semiconductor material employed. While non-emitting diodes are prepared from silicon, less frequently from germanium or selenium, the starting material for light-emitting diodes is a direct semiconductor, mostly a gallium compound as a III-V compound semiconductor.

If a voltage in the forward direction is applied to a semiconductor diode, electrons migrate from the n-doped side to the p-n junction. After having passed to the p-doped side, the electron then moves into the energetically more favorable valence band. This transition is called "recombination", because it may also be interpreted as a collision of an electron in the conduction band with a defect electron (hole). The energy released during the recombination can be emitted as light (photon) in a direct semiconductor.

In addition to direct emitting recombination, an involvement of excitons and phonons is also possible, which would lead to a slightly lower energy radiation and a shift of the emitted light into the longer wavelength range. This mechanism plays a role in excitonic emission in green gallium phosphide light-emitting diodes, in particular.

The band structure of the semiconductor determines, among other things, the behavior of the energy transfer in the transition of an electron from the conduction to the valence band and vice versa. In the LEDs that are suitable within the scope of the present invention, exclusively direct semiconductors may be contemplated. These are characterized by a "direct band transition", which means that the electrons at the lower end of the conduction band (conduction-band minimum) and at the upper end of the valence band (valence band maximum) have the same momentum. Thus, a direct transition of the electron with emission of a photon (light) is possible without a phonon having to be involved for conservation of momentum. The quantum yield of the direct semiconductor GaAs is around 0.5, and that of the indirect semiconductor Si is only around $1 \cdot 10^{-5}$.

The energy of the emitted photon equals the energy of the band gap, i.e., the energetic distance between the conduction and valence bands, $$\lambda(W_D) = \frac{h \cdot c}{W_D} \text{ with } W_D = E'' - E',$$

where $\lambda(W_D)$ is the wavelength of the emitted light, h is Planck's constant, c is the speed of light, and $W_D$ is the work.

The size of the band gap, i.e., of the energy gap $E''-E'$, determines the energy, i.e., the frequency, wavelength or color, of the emitted light. It can be controlled through the chemical composition of the semiconductor. Thus, the exchange of atoms in the crystal lattice alters the crystalline/molecular structure of the material, including its lattice parameters or even its lattice structure. For example, the semiconductor gallium arsenide has a direct band gap of 1.4 eV, corresponding to a wavelength of 885 nm, i.e., in the near IR region. The addition of phosphorus increases the band gap, which makes the emitted light higher-energy, wherein the wavelength decreases and the color changes from infrared to red and yellow. However, the increase of phosphor in the crystal also deforms the conduction band. If phosphorus replaces 50 percent of the arsenic atoms, although the band gap is almost two electron volts, which corresponds to a radiation of 650 nm (red), the band structure has shifted so much that direct radiation transitions are no longer observed, as shown in the Example on the right side. The energy of the band gap is also reflected in the level of the forward voltage of the diode. It is about 1.5 V for long wavelength light, and about 3 V for blue light.

The properties of the generated light can be varied by purposefully selecting the semiconductor materials and the dopants. Primarily, the spectral range and the efficiency can be influenced like this:

aluminum gallium arsenide (AlGaAs)—red (665 nm) and infrared to 1000 nm wavelength gallium arsenide phosphide (GaAsP) and aluminum indium gallium phosphide (AlInGaP)—red, orange and yellow gallium phosphide (GaP)—green silicon carbide (SiC)—first commercial blue LED;

zinc selenide (ZnSe)—blue emitter;

indium gallium nitride (InGaN)/gallium nitride (GaN)—ultraviolet, violet, blue and green;

white LEDs, which are preferred according to the present invention, are mostly blue LEDs with a luminescence layer in front thereof, which acts as a wavelength converter.

The illuminating device according to the invention is more preferably suitable for nitride-based LED chips, but may also be employed in other chip types, such as phosphide-based LED chips, which have GaP, AlP, InP, InGaP, AlGaP and/or InGaAlP semiconductor material, for example. Such LED chips are known, inter alia, from "Lighting your path to the future", Philips Lumileds Lighting Company, IMAPS November 2007 (to be retrieved under www.imaps.org/gbc/IMAPS07/GBC1_PhilipsLumileds.pdf), and therefore are not explained in any more detail herein.

OLEDs

A particularly preferred light source according to the invention is OLEDs. These are organic light-emitting diodes, more precisely luminous thin-layer components made of organic semiconducting materials, which are distinguished from the inorganic light-emitting diodes (LEDs) by the fact that the electric current density and luminance are lower, and no monocrystalline materials are required. As compared to conventional (inorganic) light-emitting diodes, organic light-emitting diodes can therefore be produced at a lesser cost in thin-layer technology. OLEDs are constituted of several organic layers. Mostly, a hole transport layer (HTL) is applied to the anode, consisting of indium-tin oxide (ITO), which is on a glass sheet. Often, a layer of PEDOT/PSS, which serves for lowering the injection barrier for holes and prevents indium from diffusing into the junction, is applied between the ITO and HTL, depending on the production method. The HTL is covered by a layer that either contains the dye (about 5-10%) or, rather rarely, completely consists of the dye, for example, aluminumtris (8-hydroxyquinoline), Alq3. This layer is referred to as the emitter layer (EL). It is optionally covered by an electron transport layer (ETL). For completion, a cathode consisting of a metal or an alloy with a low work function, such as calcium, aluminum, barium, ruthenium, magnesium-silver alloy, is vapor-deposited from a high vacuum. A very thin layer of lithium fluoride, cesium fluoride or silver is mostly vapor-deposited between the cathode and E(T)L as a protective layer, and to reduce the injection barrier for electrons.

The electrons are now injected from the cathode, while the anode provides the "holes", i.e., the positive charge. Holes and electrons drift towards one another and meet in the EL in an ideal case, which is why this layer is also referred to as recombination layer. Electrons and holes form a bound state, which is referred to as an exciton. Depending on the mechanism, the exciton already represents the excited state of the dye molecule, or the decay of the exciton provides the energy for exciting the dye molecule. This dye has different excitation states. The excited state can decay to the ground state, emitting a photon (light particle). The color of the emitted light depends on the energy gap between the excited and ground states and can be selectively changed by varying the dye molecules. Non-emitting triplet states give rise to a problem. These can be released by adding so-called "excitors".

Instead of the light-emitting diodes, corresponding transistors, which are referred to as LETs or OLETs, may also be used.

Supports

As explained above, the luminous element (b) and the support (c) form the so-called chip or LED chip.

Depending on the basic technology and explicit design of the LED chip, the side of the chip facing towards the primary optical element can have, for example, sapphire, SiC, GaN, InGaN, AlGaN, AlGaInN, glass, phosphorus in glass, or phosphorus in ceramics (in this respect, compare the TFFC LEDs with Lumiramic™ as described in the above mentioned publication, page 12). In this context, glass, phosphorus in glass or phosphorus in ceramics are considered as components of the LED chip.

Primary Optical Elements

The primary optical element is preferably a lens, especially a lens made of a high refractive index glass. Preferably, the element or the lens has a planar face facing towards the LED chip, while its side facing away from the LED chip has a contour producing the desired light distribution.

Figure 2:
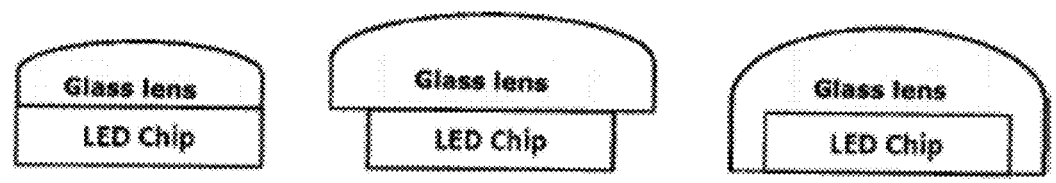
FIG. 2 illustrates a) a primary optical element having a chip scale lens, b) a primary optical element having a mushroom lens, and c) a primary optical element having a conformal lens.

The primary optical element can have such a design that it essentially covers only the surface of the LED chip ("chip scale lens"—FIG. 2a). This embodiment is selected, in particular, if the light produced in the LED chip is essentially emitted through the surface facing towards the primary optical element.

However, the primary optical element may also protrude beyond the LED chip ("mushroom lens"—FIG. 2b) and form anchoring points at the surfaces protruding beyond the chip surface.

In another embodiment, the primary optical element may also be designed with an opening in the side facing towards the LED chip, which receives the chip. Through this way of embedding the chip into the glass, the light exiting at the side surfaces of the chip may also pass over into the glass body ("conformal lens"—FIG. 2c).

Glass Composition

Another critical feature of the invention relates to the composition of the glasses of which the primary optical elements and the lenses are made. Firstly, it is to be noted that the mere circumstance that the lenses are made of glass at all rather than polysiloxane as is now customary is co-responsible for the technical success of the invention.

Only with glass lenses can so precise light irradiations be achieved, and only with glass lenses can the stability requirements also be met.

It is further required that the glasses contain oxides of tetravalent, divalent and monovalent metals. The tetravalent metal oxides are selected from the group consisting of silicon dioxide, titanium dioxide and zirconium dioxide, and mixtures thereof.

The divalent metal oxides are selected from the group consisting of calcium oxide, magnesium oxide and zinc oxide, and mixtures thereof.

The monovalent metal oxides are selected from the group consisting of sodium oxide, potassium oxide and lithium oxide, and mixtures thereof.

Preferably, the individual metal oxides are contained in about the same amounts in each of the three groups. An exception is the group of tetravalent metal oxides, in which the amount of silicon dioxide naturally is clearly prevalent. It is further advantageous if the glasses contain all the new explicitly mentioned oxides.

Concrete examples of suitable glass compositions are disclosed in Table 1. Particularly preferred compositions include:

(a1) about 58 to about 63% by weight of tetravalent metal oxides,
(a2) about 14 to about 22% by weight of divalent metal oxides,
(a3) about 14 to about 20% by weight of monovalent metal oxides,
with the proviso that the amounts sum up to 100% by weight.

Another critical quantity is the refractive index $n_D$, which preferably has a value of at least 1.5, preferably at least 1.55, more preferably at least 1.6, and especially preferably from about 1.7 to about 1.9.

In addition, the glasses are characterized in that transmissions of at least 85%, preferably at least 90%, are achieved in a spectral range of 400-800 nm for expansion coefficients of less than $10*10^{-6}$ $K^{-1}$, preferably $6*10^{-6}$ $K^{-1}$, and layer thicknesses of 10 mm.

Advantageously, the glasses have a density of from about 2.65 to about 2.75 $g/cm^3$ and especially from about 2.68 to 2.73 $g/cm^3$.

Also preferred are glasses having a defined Vickers hardness of from about 600 to about 650 HV 0.1/20.

Direct Bonding

In direct bonding (or physical bonding), two smooth and planar surfaces are bonded together only through their molecular attractive forces. For this, they must be free of dust, grease or other soil. Therefore, it is critical to the present invention that the surfaces to be bonded of the unit consisting of the primary optical element (a) on the one hand and the composite of luminous element (b) and support (c) on the other have a sufficient roughness ($R_a$) and planarity (PV).

In particular, the surfaces should have a roughness ($R_a$) of less than 10 nm and especially less than 5 nm, and preferably a planarity (PV) of less than 100 nm and especially less than 50 nm.

Such surface qualities can be achieved, for example, by grinding and polishing, by chemical-mechanical polishing (CMP), and/or by acid polishing. Especially preferred is a combination of wet-chemical etching and polishing.

INDUSTRIAL APPLICABILITY

The invention further relates to the use of the illuminating devices according to the invention for illuminating rooms. In this use, the FC LEDs can be employed singly or arranged in groups, for example, also in groups on one chip.

EXAMPLES

Examples 1 to 5

The compositions of different glasses that are suitable for the production of optical lenses according to the present invention are represented in Table 1:

TABLE 1

| Component | Glass composition | | | | |
|---|---|---|---|---|---|
| | 1 | 2 | 3 | 4 | 5 |
| Silicon dioxide | 60 | 55 | 50 | 50 | 50 |
| Titanium dioxide | 1 | 3 | 5 | 3 | 10 |
| Zirconium dioxide | 1 | 2 | 5 | 5 | 2 |
| Calcium oxide | 10 | 10 | 10 | 12 | 10 |
| Magnesium oxide | 3 | 5 | 13 | 3 | 10 |
| Zinc oxide | 3 | 5 | 5 | 6 | 5 |
| Sodium oxide | 10 | 6 | 6 | 7 | 9 |
| Potassium oxide | 10 | 12 | 3 | 7 | 2 |
| Lithium oxide | 2 | 2 | 3 | 7 | 2 |

The invention claimed is:

1. An illuminating device, comprising
   (a) a luminous element,
   (b) a support, and
   (c) a primary optical element,
   characterized in that
   (i) said luminous element (a) is present on the support (b), and
   (ii) said primary optical element (c) is arranged on a composite of luminous element (a) and support (b) in such a way that it takes up, directs and emits the radiation emerging from the luminous element in the desired light distribution, wherein
   (iii) said primary optical element (c) is fabricated from a high refractive index glass, characterized in that said high refractive index glass comprises:
      (a1) about 58 to about 63% by weight of tetravalent metal oxides,
      (a2) about 14 to about 22% by weight of divalent metal oxides,
      (a3) about 14 to about 20% by weight of monovalent metal oxides, and
   (iv) said primary optical element (c) is attached to the support by direct bonding.

2. The illuminating device according to claim 1, characterized in that said luminous element (a) is selected from the group consisting of LEDs, OLEDs, LETs and OLETs.

3. The illuminating device according to claim 1, characterized in that said luminous element (a) is a nitride-based LED.

4. The illuminating device according to claim 3, characterized in that said luminous element (a) is LEDs containing GaP, AlP, InP, InGaP, AlGaP and/or InGaAlP as semiconductors.

5. The illuminating device according to claim 1, characterized in that said luminous element (a) and said support (b) form a chip.

6. The illuminating device according to claim 1, characterized in that said primary optical element (c) is a lens.

7. The illuminating device according to claim 6, characterized in that said lens has a planar side facing towards the composite of luminous element and support.

8. The illuminating device according to claim 1, characterized in that the high refractive index glass has a refractive index nD of at least 1.5.

9. The illuminating device according to claim 8, characterized in that said high refractive index glass has a refractive index nD of at least 1.7.

10. The illuminating device according to claim 1, characterized in that the surfaces to be bonded of the unit consisting of the primary optical element (c) on the one hand and the composite of luminous element (a) and support (b) on the other have a roughness (Ra) of less than 10 nm.

11. The illuminating device according to claim 10, characterized in that the surfaces have a roughness (Ra) of less than 5 nm.

12. The illuminating device according to claim 1, characterized in that the surfaces to be bonded of the unit consisting of the primary optical element (c) on the one hand and the composite of luminous element (a) and support (b) on the other have a planarity (PV) of less than 100 nm.

13. The illuminating device according to claim 12, characterized in that the surfaces have a planarity (PV) of less than 50 nm.

14. The illuminating device according to claim 1, wherein the device is a room-illuminating device.

\* \* \* \* \*